United States Patent
Bratkovski et al.

(10) Patent No.: US 8,247,060 B2
(45) Date of Patent: Aug. 21, 2012

(54) FLEXIBLE METAMATERIAL STRUCTURE BASED ON GRAPHENE STRUCTURES

(75) Inventors: Alexandre M. Bratkovski, Mountain View, CA (US); Iakov Veniaminovitch Kopelevitch, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 270 days.

(21) Appl. No.: 12/771,994

(22) Filed: Apr. 30, 2010

(65) Prior Publication Data
US 2011/0268910 A1    Nov. 3, 2011

(51) Int. Cl.
*B32B 3/16* (2006.01)
(52) U.S. Cl. ...................... 428/78; 428/195.1
(58) Field of Classification Search .................... 428/78, 428/195.1
See application file for complete search history.

(56) References Cited

U.S. PATENT DOCUMENTS
2011/0042650 A1*  2/2011  Avouris et al. .................. 257/29

OTHER PUBLICATIONS
B. Wood and J. B. Pendry, J. Phys.: Metamaterials at zero frequency Condens. Mater. 19, 076208 (2007).
D. L. Miller et al., Observing the Quantization of Zero Mass Carriers in Graphene ;Science 324, 924 (2009).
F. Magnus et al., A d.c. magnetic metamaterial Nature Mater. 7, 295 (2008).
H. Ohldag et al., Electron Ferromagnetism in Metal-Free Carbon Probed by Soft X-Ray Dichroism; Phys. Rev. Lett. 98, 187204 (2007).
J. B. Pendry et al., Controlling Electromagnetic Fields Science 312, 1780 (2006).
M. Koshino et al., Magnetic field screening and mirroring in graphene; Phys. Rev. Lett. 102, 177203 (2009.
M. Orlita et al., Approaching the Dirac Point in High-Mobility Multilayer Epitaxial Graphene Phys. Rev. Lett. 101, 267601 (2008).
M. P. Sharma et al., Diamagnetism of Graphite Phys. Rev. B 9, 2467 (1974).
P. Esquinazi et al., Ferromagnetism in oriented graphite samples; Phys. Rev. B 66, 024429 (2002).
Y. Kopelevich et al., J.; Ferromagnetic- and Superconducting-Like Behavior of Graphite; Low Temp. Phys. 119, 691 (2000).

* cited by examiner

*Primary Examiner* — Alexander Thomas

(57) ABSTRACT

A flexible graphene-based metamaterial structure is disclosed that can operate at above liquid helium or liquid nitrogen temperatures, up to room temperature or above in applications similar to those for which a superconductor-based material structure is used. The flexible graphene-based metamaterial structure is formed from a flexible substrate, and a plurality of two-dimensional graphene blocks disposed in an array on the flexible substrate, each graphene block having a plurality of graphene sheets. The lateral dimension of the face of the graphene blocks is dependent on the temperature of operation of the flexible metamaterial structure. The flexible graphene-based metamaterial structure can be used for cloaking, with application in magnetic shielding.

20 Claims, 3 Drawing Sheets

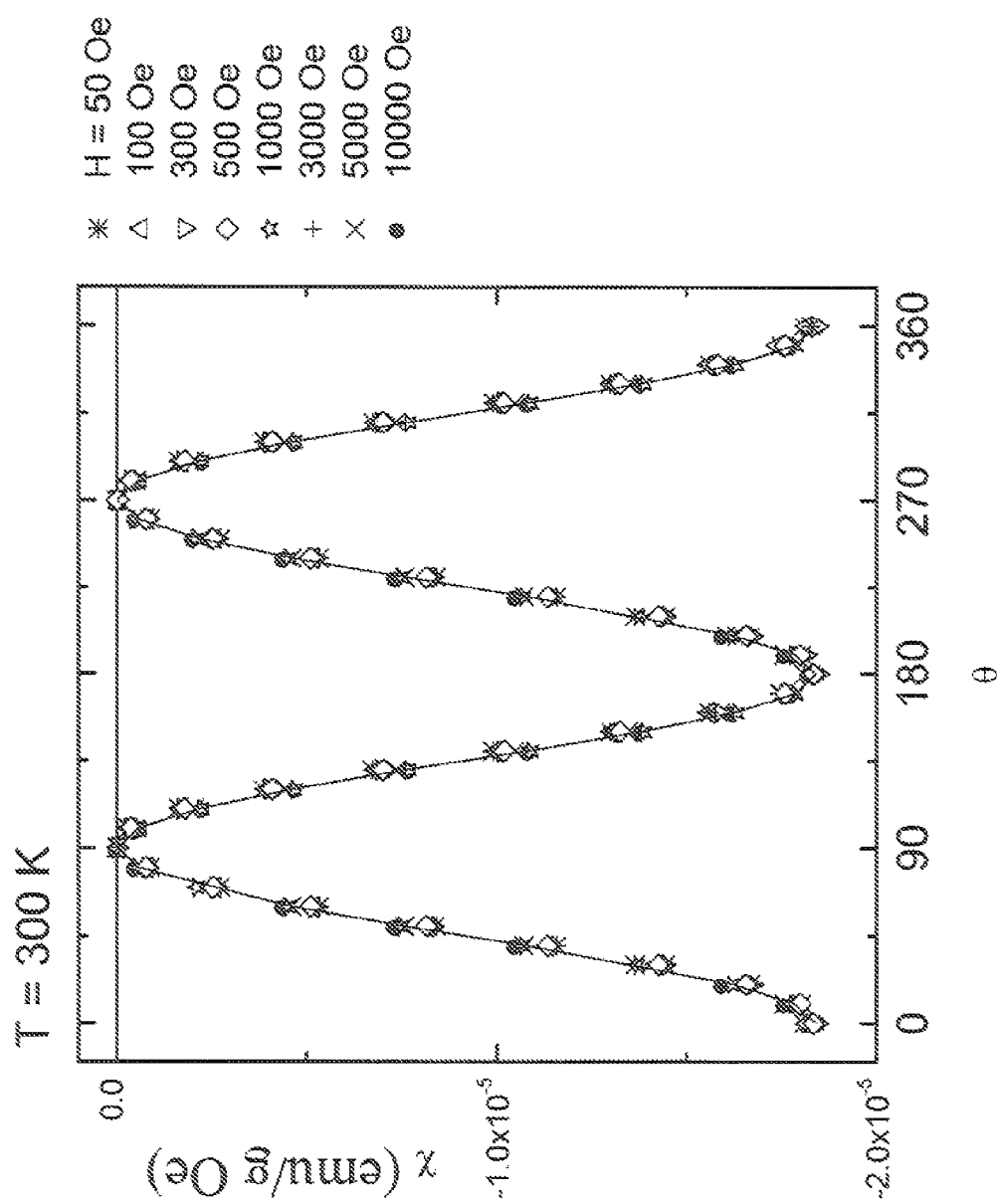

US 8,247,060 B2

FLEXIBLE METAMATERIAL STRUCTURE BASED ON GRAPHENE STRUCTURES

TECHNICAL FIELD

This disclosure relates to a flexible graphene-based metamaterial structure.

BACKGROUND

Metamaterials can exhibit such properties as negative refraction and cloaking from microwaves. See Pendry et al., 2006, *Science* 312, 1780. A low-frequency and/or DC metamaterials can be made out of diamagnetic substances, for example, a superconductor, allowing for engineering of magnetic cloaks, which can shield the magnetic field in their interior without substantially affecting the field on the outside. See, e.g., Wood et al., 2007, *J. Phys.: Condens. Mater.* 19, 076208, Magnus et al., 2008, *Nature Mater.* 7, 295. A DC metamaterial made of superconducting Pb flakes (or plates) that operates in the presence of liquid helium temperature (T=4.2 K), since the superconducting temperature ($T_c$) is approximately 7 K, has been disclosed (see Magnus et al.). One of the main obstacles for a broad practical use of the superconductor-based metamaterials is the low operation temperature and cryogenic liquids that may be required for such operation, such as helium (T=4.2 K) or nitrogen (T=77 K), in the case of a high-$T_c$ superconductor).

A DC metamaterial structure capable of operating at room temperature is beneficial.

BRIEF DESCRIPTION OF THE DRAWINGS

FIG. 3 shows the angular dependence ($\Theta$) of the diamagnetic susceptibility ($\chi$) for different of applied magnetic fields (H) of magnitude ranging from 30 Oe to 104 Oe.

DETAILED DESCRIPTION

Reference is made herein to the accompanying drawings, which form a part hereof, and in which is shown by way of illustration a specific example in which the invention may be practiced. It is to be understood that other embodiments may be utilized and structural changes may be made without departing from the scope of the present invention. As used herein, the term "includes" means includes but not limited to, the term "including" means including but not limited to. The term "based on" means based at least in part on.

Disclosed herein are metamaterial strictures that are made using an arrangement of graphitic structures, namely, graphene blocks. The graphene block can be an isolated graphitic plane (also referred to herein as a graphene sheet), several (two or more) stacked graphene sheets (graphitic planes), or many graphene sheets (also referred to herein as graphite). In one example, the graphene block is HOPG. The metamaterial structures disclosed herein are capable of operating at higher temperatures than a metamaterial based on a superconductor. For example, the graphene-based metamaterial structures can be operated above liquid helium temperature (T=4.2 K), above liquid nitrogen temperature (T=77 K), or temperature up through room temperature. In another example, the graphene-based metamaterial structures can be operated above room temperature. The metamaterial structures are comprised of graphene blocks arranged on a substrate. In one example, the graphene blocks are arranged in a periodic lattice on the substrate.

Figure 1:
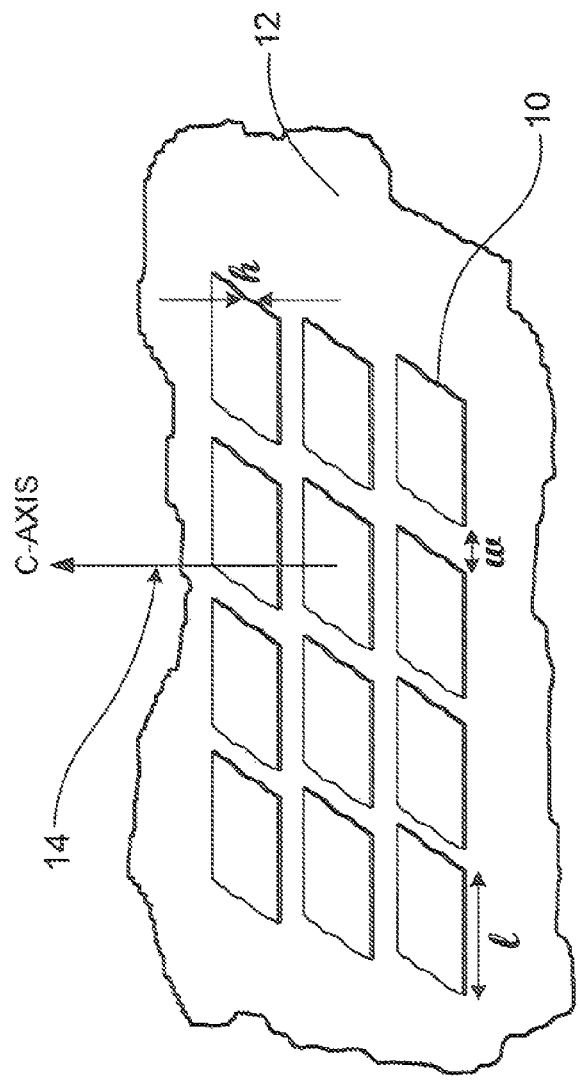
FIG. 1 shows an example metamaterial structure comprised of graphene blocks.

FIG. 1 shows an example of the metamaterial structure disclosed herein. The metamaterial structure is based on a lattice of macroscopic-sized graphene-based elements. The graphene-based metamaterial is formed from an arrangement of graphene blocks 10 on a substrate 12. The graphene blocks 10 are depicted in FIG. 1 as a cuboid having a substantially square face, of dimension l×l, and height h. In another example, the graphene blocks 10 can be cuboids having a substantially rectangular face of dimension l×d, with d less than l, and height h. In yet another example, the face of the graphene blocks 10 can have an irregular shape, or other parallelepiped shape with a major dimension l (such as the longest lateral length). The metamaterial material structure can be approximated as a quasi-two-dimensional (2D) structure, since height h is generally significantly smaller than dimension l. The graphene blocks 10 are spaced apart with a spacing of dimension w.

The graphene-based metamaterial structures disclosed herein can be used in applications similar to those that use superconductor-based metamaterial structures. For example, the graphene-based metamaterial structures disclosed herein can be used to cloak a region, which has applications in magnetic shielding technology. However, the graphene-based metamaterial structures disclosed herein can be operated at or around room temperature, unlike superconductor-based metamaterial structures. In an application where the graphene-based metamaterial structures are used for a magnetic shielding effect, when a DC magnetic field (zero frequency) is applied perpendicular to the planes of the graphene blocks 10 (see c-axis 14 of FIG. 1), it is expelled from the graphene blocks 10, while the effect is practically negligible in the parallel magnetic field configuration. In an example, the graphene-based metamaterial structures can be used for a magnetic shielding effect when a magnetic field of a finite, low frequency, for example, of a frequency below that of the (anti)ferromagnetic resonant frequency of the graphene blocks 10, is applied perpendicular to the planes of the graphene blocks 10 (see c-axis 14 of FIG. 1). The graphene-based metamaterial structures disclosed herein can be produced by square kilometer in a roll-to-roll process cost-effectively compared to a superconductor-based metamaterial structure.

The graphene-based metamaterial structures disclosed herein take advantage of the strongly anisotropic magnetic response of graphene and graphite. The anisotropic magnetic response originates from the quasi-two-dimensional (2D) layered structure. When a magnetic field (H) is applied perpendicular ($\perp$) to the graphitic planes, i.e., along the hexagonal c-axis of the graphitic plane (see c-axis 14 of FIG. 1), the room temperature diamagnetic susceptibility ($\chi$) is very large (on the order of $\chi_\perp \sim -1\times10^{-5}$ emu/g Oe that allows graphite to levitate in low magnetic fields (~1 T). The diamagnetic susceptibility for a magnetic field (H) applied parallel ($\parallel$) to the graphitic planes $\chi_\parallel \sim -1\times10^{-7}$ emu/g Oe, i.e., at least two orders of magnitude smaller than the magnetic response to the perpendicular magnetic field. The measured diamagnetic response of graphene blocks 10 (such as HOPG) for a magnetic field (H) applied parallel ($\parallel$) to the planes may be an artifact of a finite FWHM (full width at half maximum of x-ray rocking curves), originating from an inevitable c-axis diamagnetism contribution (such as, due to plane misalignment). HOPG also can demonstrate ferromagnetic-like hysteresis loops that are unrelated to magnetic impurities.

Figure 2A:
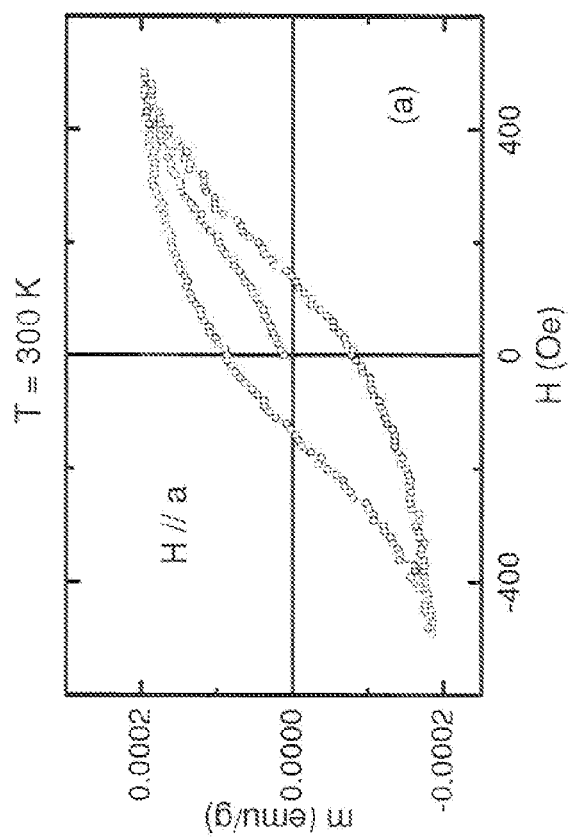
FIG. 2A shows the low-field portion of the magnetization m(H) measured for highly-ordered pyrolytic graphite (HOPG) at room temperature (T about 300 K), for a magnetic field applied parallel to the graphene planes.
Figure 2B:
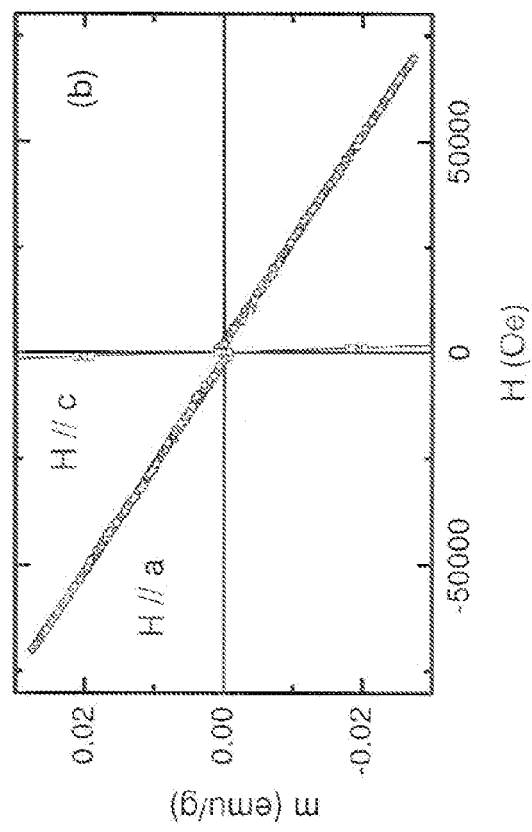
FIG. 2B shows the magnetization m(H) measured for HOPG at room temperature (T about 300 K), for a magnetic field applied both perpendicular to the planes and parallel to the planes.

FIG. 2A shows the low-field portion of the magnetization m(H) measured for HOPG at room temperature (T about 300 K), for a magnetic field (H) applied parallel to the graphene planes (H∥a), after subtraction of a small diamagnetic background signal. Specifically. FIG. 2A exemplifies the ferromagnetic-like response of HOPG samples, with full-width at half-max (FWHM)=0.4°. FIG. 2B shows the magnetization m(H) measured for HOPG at room temperature (T about 300 K), measured for both a magnetic field (H∥c) applied perpendicular ($\perp$) to graphitic planes ($\chi_\perp \sim -1 \times 10^{-5}$ emu/g Oe) and a magnetic field (H) applied parallel (∥) to the graphitic planes ($\chi_\parallel \sim -4 \times 10^{-7}$ emu/gOe) configurations. FIG. 2B demonstrates the strongly anisotropic diamagnetic response for the two orthogonal directions of the measuring magnetic field (H).

FIG. 3 shows a plot of the angular dependence of the diamagnetic susceptibility obtained with application of various magnetic field strengths at room temperature for ZYA HOPG (a very high quality grade of graphite) for various applied magnetic fields ranging from H=30 Oe to H=10⁴ Oe (as indicated in FIG. 3). The magnetic field response of the graphene-based structure disclosed herein (shown in FIG. 3) allows it to function as a DC metamaterial structure. The solid line fit to the data points is obtained using the equation $\chi(\Theta) = \chi_\parallel(\sin^2\Theta + \gamma \cos^2\Theta)$, where $\gamma=800$, $\chi_\parallel=-0.23\times 10^{-7}$ emu/gOe, and $\Theta$ is the angle between the applied magnetic field (H) and the c-axis of the graphitic plane. The approximation, $\chi(\Theta) \sim \cos^2\Theta$, also can be used for the fit (similarly to superconductor-based metamaterials).

The major dimension, l, of the graphene blocks 10 used for an application is controlled dependent on the intended temperature of operation of the metamaterial structure. In one example, the major dimension, l, decreases as the intended temperature of operation of the metamaterial structure increases. In an example, the major dimension, l, is the lateral size of the graphene block. In an example, the dimension l can be approximated by the equation $h\nu/k_B T$, where T is temperature, h is Planck's constant, $\nu \sim 10^6$ m/s, and $k_B$ is Boltzmann's constant. Values of the dimension l can be on the order of several microns (μm) depending on the temperature of operation. In an example, for low temperature operation, for about T=1 K, the major dimension of each graphene block can be approximately 1~50 μm or larger. In an example, for room temperature operation (T about 300 K), the major dimension of each graphene block can be approximately 1~0.2 μm or larger, which can provide a perfectly diamagnetic metamaterial structure. For operation about liquid nitrogen temperature (T=77K), up to room temperature, or above room temperature, the dimension l can be up to about 0.5 μm, up to about 1 μm, up to about 8 μm, up to about 15 μm, up to about 30 μm, up to about 50 μm, up to about 80 μm, or greater. In an example, the value of l computed using the equation $h\nu/k_B T$, for an intended temperature of operation, is the minimum lateral dimension of the graphene blocks 10 used for the application. In the case of isolated graphitic planes (without the interlayer hopping), the diamagnetism can be enhanced by stacking graphene sheets to provide the graphene blocks 10. Almost perfect diamagnetism (for H perpendicular ($\perp$) to the planes) for a graphene block thickness of about 10 μm with the interlayer (inter-graphene) spacing of about 0.334 nm, as in the Bernal ABABAB . . . graphite. Thus, the minimum height (h) of the graphene blocks 10 used in the application is about 10 μm. In an example, a metamaterial structure comprised of an array of graphene blocks 10 having dimensions l×l×h=100 μm×100 μm×10 μm can be used in low temperature applications as well as applications at or around room temperature, or even above room temperature. In another example, the height h can be up to about 15 μm, up to about 30 μm, up to about 50 μm, up to about 80 μm, up to about 100 μm, or greater.

For an application such as magnetic cloaking, the metamaterial structure is exposed to low-frequency or zero-frequency (DC) magnetic fields. The key requirement for a functioning of such MM is to have a tunable, diamagnetic, and highly anisotropic magnetic susceptibility tensor.

In an example, the spacing (w) between the graphene blocks 10 is about 10 μm or less. In another example, the spacing (w) between the graphene blocks 10 is between about 10 μm and about 50 μm. The spacing (w) between the graphene blocks 10 can be about 30 μm, about 50 μm, or greater than 50 μm. In a magnetic shielding effect, such as cloaking, the field is expelled from a given volume of the flexible metamaterial structure, the expulsion causing an object on the opposite side of the flexible metamaterial structure to be effectively shielded from the field. The expulsion can create areas of amplified field at or near the periphery of the object being shielded. These maxima of the field may reveal to an observer that there is an object being shielded behind the flexible metamaterial structure. The field returns to an unperturbed value at a distance away from the spacing (w) between the graphene blocks 10, at a distance approximately equal to the size of the spacing. A maximal value of spacing (w) between the graphene blocks 10 can be determined as the distance from the flexible metamaterial structure where the field concentration of these field maxima is reduced to a negligible amount. For example, if this distance is about 10 microns, the spacing (w) can be determined as about 10 microns. In another example, if this distance is about 30 microns, the spacing (w) can be determined as about 30 microns. In an example, a value of the gap smaller than 50 microns can provide for better magnetic flux expulsion.

The dimensions of the device can be modified and adopted to the intended application. The optimization of the field can be done on the basis of the following estimates for the magnetic field inhomogeneity produced by the graphene blocks 10 in an external field $H_0$. The radial ($H_r$) and azimuthal ($H_\Theta$) components of the field $$H_r = H_0 \cos\theta \left[1 + 2\left(\frac{R_0}{r}\right)^3 \frac{\mu-1}{\mu+2}\right],$$

$$H_\theta = H_0 \sin\theta \left[-1 + \left(\frac{R_0}{r}\right)^3 \frac{\mu-1}{\mu+2}\right],$$

where $H_0$ is the external magnetic field oriented along the z-axis (see c-axis 14 of FIG. 1), $R_0$ is about a half of a linear size of the graphene block, $\mu = 1+\chi$, $\chi$ is the magnetic susceptibility of the graphene block, and r is the distance from the center of the graphene block to the point where the field is measured.

In an example, the metamaterial structure disclosed herein is a flexible structure comprised of a two-dimensional (2D) array of the graphene blocks 10 disposed on a flexible substrate 12. Examples of flexible substrates include a substrate formed based on silicon (Si) or silicon carbide (SiC), or a flexible polymer film, or other flexible material. The polymer film can be a film based on polyethylene terephthalate. The graphene blocks 10 can be disposed on a surface of the flexible substrate 12, or on both surfaces of the flexible substrate 12. The graphene blocks 10 can be disposed in the flexible substrate 12, for example, the graphene blocks 10 can be embedded into the flexible substrate 12. In an example, the flexible metamaterial structures herein can be rolled into a cylindrical geometry (kilometers in length) in a roll-to-roll process. Since graphene can be made to maintain its properties at a nanometer scale, the density of active elements in the metamaterial structure can be very high. The metamaterial structures are comprised of a light element, carbon, and can be made light-weight, which is advantageous for many applications.

In an example, the metamaterial structures can be made a three-dimensional (3D) structure that is fabricated from multiple, stacked or overlapping layers of the metamaterial structures disclosed herein.

The graphene blocks in the graphene-based metamaterial structure can be formed from a multi-layered graphene system grown on a substrate, such as silicon carbide (SiC), and than cut into blocks such as those illustrated in FIG. 1 (graphene blocks 10). The graphene block thickness depends on the number of graphene layers that are deposited. As discussed above, the minimum height (h) of the graphene blocks used in the application can be about 10 μm. Examples of cutting processes that can be used include laser cutting, ion beam, electron beam, oxygen etching. In one example, the graphene blocks are deposited in a contiguous fabrication process with the formation of the flexible substrate. In another example, the graphene blocks are pre-fabricated, and are positioned on or embedded into the flexible substrate during formation of the flexible substrate.

The metamaterial structures are suitable for use in a variety of devices. Non-limitative examples of such devices include flexible structures, magnetic cloaking devices, micro-electrical mechanical (MEMS) structures, interconnects, sensors, or the like. The metamaterial also are suitable for use in a variety of applications. Non-limitative examples of such applications include magnetic shielding. MEMS structures, sensor fabrics, or the like.

In an application in which the metamaterial structures are used as part of a micro-electro-mechanical system (MEMS), the flexible metamaterial structure can be formed as a part of a mechanical element, a sensor, an actuator, or the electronics of the MEMS device. For example, one or more of the graphene blocks are position on or near an actuator element of the MEMS device, such that each graphene block or each cluster of the graphene blocks moves when the corresponding actuator is actuated. In an example of a MEMS device including the flexible metamaterial structure which can operate as a tunable magnetic shield for variable cloaking, one or more of the graphene block or clusters of blocks can be moved to extend outwards from the two-dimensional plane of the system. The magnetic field component directed perpendicular to the plane of the MEMS device would be shielded by the sections of the MEMS device that were not actuated to move the graphene block or clusters of blocks to extend outwards out of the plane. The MEMS devise acts as a tunable magnetic shielding device, since the total shielding capacity of the device depends on the proportion of the graphene block, or clusters of blocks, moved out of the plane versus those remaining in the plane. The fabrication techniques for MEMS devices are compatible with those used for growing the graphene blocks Many modifications and variations of this invention can be made without departing from its spirit and scope, as will be apparent to those skilled in the art. The specific examples described herein are offered by way of example only, and the invention is to be limited only by the terms of the appended claims, along with the full scope of equivalents to which such claims are entitled.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

All references cited herein are incorporated herein by reference in their entirety and for all purposes to the same extent as if each individual publication or patent or patent application was specifically and individually indicated to be incorporated by reference in its entirety herein for all purposes. Discussion or citation of a reference herein will not be construed as an admission that such reference is prior art to the present invention.

What is claimed is:

1. A flexible metamaterial structure comprising:
    a flexible substrate; and
    a plurality of two-dimensional graphene blocks disposed in an array on, or embedded in, the flexible substrate, wherein each graphene block comprises a plurality of graphene sheets, wherein a minimum lateral dimension (l) of the face of the graphene blocks is dependent on the temperature (T) of operation of the flexible metamaterial structure, wherein the flexible metamaterial structure is a two-dimensional structure having a first side and a second side opposite to the first side, wherein the metamaterial structure exhibits a magnetic shielding effect of a component of a magnetic field that is applied to the first side of the flexible metamaterial structure, and wherein the magnetic shielding effect reduces the magnitude, on the second side of the flexible metamaterial structure, of the component of the magnetic field that is directed perpendicular to the first side of the flexible metamaterial structure; and
    wherein the graphene blocks are spaced apart in the array and wherein said spacing is by a distance of one of: about 10 microns or less, about 30 microns, about 50 microns or more, and between about 10 microns and about 50 microns.

2. The flexible metamaterial structure of claim 1, wherein the magnetic field is a DC magnetic field.

3. The flexible metamaterial structure of claim 1, wherein the magnetic field is a low-frequency magnetic field of a frequency below an (anti)ferromagnetic resonant frequency of the graphene blocks.

4. The flexible metamaterial structure of claim 1, wherein the graphene blocks are highly-ordered pyrolytic graphite.

5. The flexible metamaterial structure of claim 1, wherein each graphene block is a cuboid having an approximately square face of lateral dimension l.

6. The flexible metamaterial structure of claim 5, wherein l is approximated by $hv/k_B T$, wherein T is the temperature of operation of the flexible metamaterial structure, h is Planck's constant, $v \sim 10^6$ m/s, and $k_B$ is Boltzmann's constant.

7. The flexible metamaterial structure of claim 5, wherein l is about 50 μm when T is about 1 K.

8. The flexible metamaterial structure of claim 5, wherein l is about 0.2 μm when T is about room temperature.

9. The flexible metamaterial structure of claim 1, wherein the graphene blocks are spaced apart in the array by the distance of about 10 microns or less.

10. The flexible metamaterial structure of claim 1, wherein the graphene blocks are spaced apart in the array by the distance between of about 10 microns and about 50 microns.

11. The flexible metamaterial structure of claim 1, wherein the graphene blocks are spaced apart in the array by the distance of about 30 microns.

12. The flexible metamaterial structure of claim 1, wherein the graphene blocks are spaced apart in the array by the distance of about 50 microns or more.

13. The flexible metamaterial structure of claim 1, wherein the flexible substrate comprises one of silicon carbide and silicon.

14. The flexible metamaterial structure of claim 1, wherein the flexible substrate comprises a polymer.

15. The flexible metamaterial structure of claim 14, wherein the polymer comprises polyethylene terephthalate.

16. A three-dimensional flexible metamaterial structure comprising two or more sheets of the flexible metamaterial structure of claim 1.

17. A flexible metamaterial structure comprising:
a flexible substrate; and
a plurality of two-dimensional graphene blocks disposed in an array on, or embedded in, the flexible substrate, wherein each graphene block comprises a plurality of graphene sheets, wherein a minimum lateral dimension (l) of the face of the graphene blocks is dependent on the temperature (T) of operation of the flexible metamaterial structure, wherein the flexible metamaterial structure is a two-dimensional structure having a first side and a second side opposite to the first side, wherein the metamaterial structure exhibits a magnetic shielding effect of a component of a magnetic field that is applied to the first side of the flexible metamaterial structure, and wherein the magnetic shielding effect reduces the magnitude, on the second side of the flexible metamaterial structure, of the component of the magnetic field that is directed perpendicular to the first side of the flexible metamaterial structure; and
wherein each graphene block is a cuboid having an approximately square face of lateral dimension l such that l is approximated by $hv/k_B T$, wherein T is the temperature of operation of the flexible metamaterial structure, h is Planck's constant, $v \sim 10^6$ m/s, and $k_B$ is Boltzmann's constant.

18. A flexible metamaterial structure comprising:
a flexible substrate; and
a plurality of two-dimensional graphene blocks disposed in an array on, or embedded in, the flexible substrate, wherein each graphene block comprises a plurality of graphene sheets, wherein a minimum lateral dimension (l) of the face of the graphene blocks is dependent on the temperature (T) of operation of the flexible metamaterial structure, wherein the flexible metamaterial structure is a two-dimensional structure having a first side and a second side opposite to the first side, wherein the metamaterial structure exhibits a magnetic shielding effect of a component of a magnetic field that is applied to the first side of the flexible metamaterial structure, and wherein the magnetic shielding effect reduces the magnitude, on the second side of the flexible metamaterial structure, of the component of the magnetic field that is directed perpendicular to the first side of the flexible metamaterial structure; and
wherein each graphene block is a cuboid having an approximately square face of lateral dimension such that l is one of about 50 µm when T is about 1 K and about 0.2 µm when T is about room temperature.

19. The flexible metamaterial structure of claim 18, wherein l is about 50 µm when T is about 1 K.

20. The flexible metamaterial structure of claim 18, wherein l is about 0.2 µm when T is about room temperature.

* * * * *